United States Patent [19]

Welch et al.

[11] Patent Number: 5,440,576

[45] Date of Patent: Aug. 8, 1995

[54] BRANCHED MOPA DEVICE WITH PHASED ARRAY OF AMPLIFIERS

[75] Inventors: David F. Welch, Menlo Park; Robert J. Lang, Pleasanton; Julian S. Osinski, Palo Alto; Kenneth M. Dzurko, San Jose; David G. Mehuys, Sunnyvale; Robert G. Waarts, Palo Alto, all of Calif.

[73] Assignee: SDL, Inc., San Jose, Calif.

[21] Appl. No.: 229,383

[22] Filed: Apr. 18, 1994

[51] Int. Cl.6 .................................................. H01S 3/10
[52] U.S. Cl. ...................................... 372/50; 359/349; 385/14
[58] Field of Search .................... 372/50, 26; 359/344, 359/346, 349; 385/2, 3, 14

[56] References Cited

U.S. PATENT DOCUMENTS 5,003,550  3/1991  Welch et al. ............................ 372/50
5,321,718  6/1994  Waarts et al. ........................... 372/50

Primary Examiner—James W. Davie
Attorney, Agent, or Firm—Schneck & McHugh

[57] ABSTRACT

A phased array of flared amplifiers fed by phase adjusters and a power splitter produces a single high power beam when the flared amplifier sections are aligned and closely spaced. In one embodiment the array is excited by a DBR laser integrated into the same substrate as the flared amplifiers. In another embodiment the array is self-excited and forms a laser between an edge of the substrate common to the power splitter and an edge of the substrate common to the flared amplifier.

11 Claims, 2 Drawing Sheets

BRANCHED MOPA DEVICE WITH PHASED ARRAY OF AMPLIFIERS

STATEMENT AS TO RIGHTS TO INVENTIONS MADE UNDER FEDERALLY-SPONSORED RESEARCH AND DEVELOPMENT

This invention was made with government support under Contract No. F29601-91C-0012, awarded by the Department of the Air Force. The government has certain rights in the invention.

TECHNICAL FIELD

The present invention relates to broad emitter laser diode arrays, some with optical power amplifiers, and to monolithically integrated, master oscillator power amplifier (MOPA) devices having such amplifiers.

BACKGROUND ART

In U.S. Pat. No. 5,003,550, Welch et al. describe a monolithic MOPA device having a steerable output beam. The device includes a single mode diode laser with distributed Bragg reflector (DBR) gratings, an optical amplifier disposed in tandem with the laser and a detuned second order grating surface output coupler disposed to receive the amplified light, all formed on a common substrate. The diode laser is tunable by means of a separate tuning current $I_t$ applied to the rear DBR grating. The amplifier is a flared waveguide coupled to receive the laser output and electrically pumped to provide optical power gain to the received light. In an alternate embodiment, the amplifier is a power splitter network of branching single mode waveguides coupled at Y-junctions. The branched waveguides are followed by an array of single mode gain waveguides. The power splitter portion is pumped to compensate for scattering and splitting losses at the Y-junctions, while the single mode gain waveguides are pumped to provide an optical power gain to the lightwaves. Tuning the laser, in conjunction with the surface output coupler grating, produces a longitudinal steering of the output beam. Lateral phase controllers having an array of separately addressed electrodes may be incorporated between the amplifier output and the surface output coupler to adjust the optical path length, in order to enable compensation for lateral phase variations in the amplifier and to provide lateral steering of the output beam.

In patent application Ser. No. 08/202,359, assigned to the assignee of the present invention, Welch et al. show a monolithic, multiple flared amplifier device excited by a DBR laser.

With reference to FIG. 1, describing the structure of the aforesaid patent application, the output of a laser oscillator 11 is coupled to a first preamplifier section 19 that branches at points 59 and 61 into multiple second preamplifier sections 63, each comprising a single mode waveguide 65, with conductive contacts over the waveguides 65 for optically pumping the preamplifier sections 63. An array of flared optical amplifiers 67 optically couple to the respective outputs of the preamplifier waveguides 65. The width of each amplifier gain region 69 in the array 67 matches at an input end the width of the preamplifier waveguides 65 and increases with the light divergence toward the output facet 27. Preferably, the gain regions 69 are sufficiently wide at the facet 27 to completely fill, or nearly completely fill, the entire width of the facet 27 with the emitted light 73, with little or no dark space between adjacent light beam array elements. The facet 27 is preferably set at a non-perpendicular angle to the direction of light propagation in the amplifier array 67. In this fashion, it is possible to inject several flared amplifiers with a single laser oscillator, resulting in a high power coherent output. In addition, the branching waveguides can sometimes be designed to have equal optical path lengths in order to produce equal phase at the output facets. In other instances, the branching waveguides cannot be designed to have equal optical path lengths.

An object of the invention was to devise a MOPA array of increased power output, minimal dark space between laser elements and strong coherency.

SUMMARY OF THE INVENTION

The above object has been met with a phased array of high power, coherent, flared amplifiers in a master oscillator power amplifier configuration, all on a single monolithic substrate. A distributed Bragg reflector (DBR) laser has a waveguide which feeds light to a power splitter having branches which feed individually addressable phase adjusters. The phase adjusters compensate for waveguide path length differences, allowing for non-symmetric branching in the power splitter. In turn, this allows more efficient use of available space on a substrate and allows all light to emerge from a side of the substrate oriented at an angle to the oscillator. From the phase adjusters, light is directed to individual flared amplifiers having outputs which may be closely aligned, providing an output which is high power, highly coherent and diffraction limited.

BEST MODE FOR CARRYING OUT THE INVENTION

Figure 1:
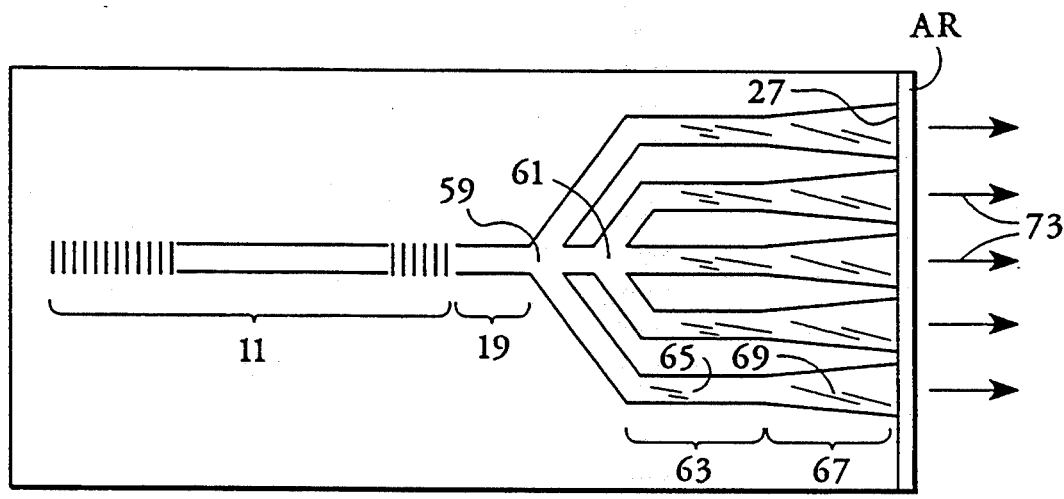
FIG. 1 is the plan view of a laser array of the prior art having a DBR oscillator, a branching structure and flared amplifiers.
Figure 2:
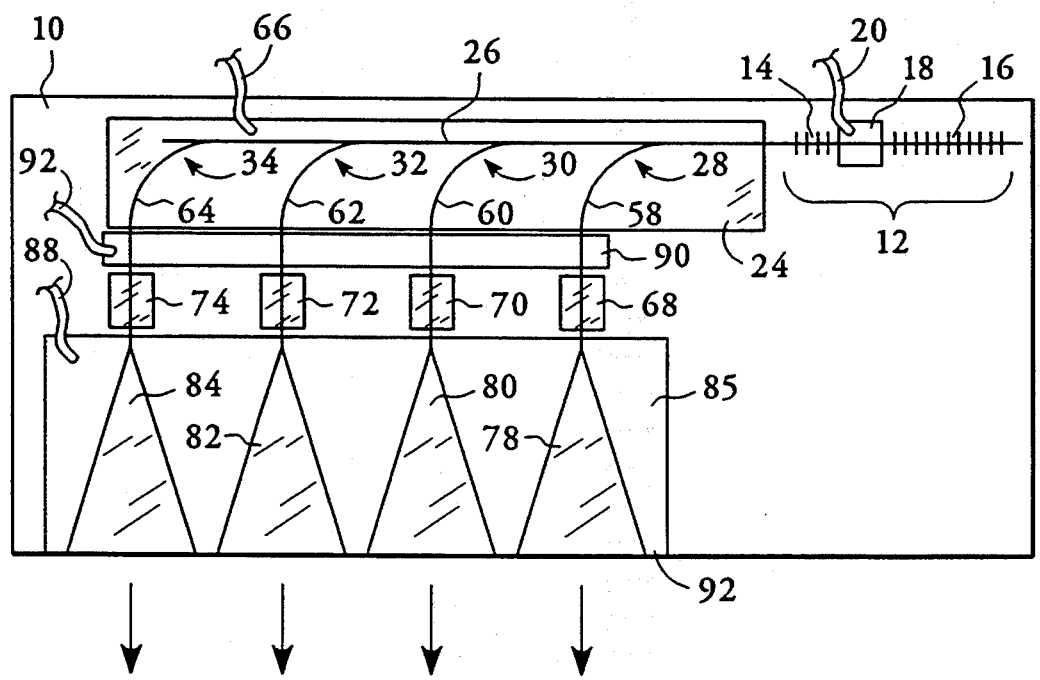
FIG. 2 is a top plan view of a phased array of a high power, monolithic flared amplifier in accord with the present invention.

With reference to FIG. 2, a first portion of a semiconductor substrate 10 contains a DBR master oscillator 12 having an active region for lightwave generation. An InGaAs/AlGaAs quantum well heterostructure on a GaAs substrate is typical, but other well-known laser diode layer structures could also be used. The active region is bounded by a pair of distributed Bragg reflectors 14 and 16 along a waveguide, providing feedback of lightwaves in a waveguide region in or near the active region. The waveguide of the DBR laser is approximately 5 micrometers wide and supports a single spatial mode, up to about 100 mW. A central gain portion of the laser has a contact 18 for current pumping by the current $I_{OSC}$ transmitted by wire 20.

The reflectors 14 and 16 may be first or second order gratings, preferably with a grating period matched to the first order Bragg condition of the laser light. However, for gallium arsenide active regions, it is difficult to fabricate such a matching grating period and so second order gratings are preferred. If there is significant light loss with second order gratings, substrate reflectors should be employed. The rear grating 16 is longer than the front grating 14, in order to provide higher reflectivity, namely greater than 90% is preferred. The additional length of the rear grating provides strong frequency selectivity. A cleaved mirror could also be used to replace the rear grating.

The output of DBR oscillator 12 is light fed along waveguide 22 to the power splitter network 24 which is on a second portion of the substrate 10. The splitter network resembles a tree having a central trunk 26 with branches 28, 30, 32 and 34 formed as a serial chain of identical Y-branches, with branching angles of about 2 degrees. Each branch connects to a curved waveguide 58, 60, 62, 64, respectively, whose radius of curvature is less than 2 mm and preferably about 1 mm. Each branch makes an approximate right angle with the splitter trunk so that light is directed toward an elongated dimension or edge 92 of substrate 10. Edge 92 is given an antireflection coating for greater light output, with less than 0.1% reflectivity. Output facets of the amplifiers are parallel to the oscillator waveguide and aligned with an edge of the substrate.

The entire branching network is actively pumped by a current injected by wire 66. This current, $I_{dist}$ is injected at a point where a distribution of current may be made to offset power attenuation as light travels from one branch to the next. In other words, the current $I_{dist}$ serves to equalize power in each branch of the power splitter 24. Besides offsetting current loss due to splitting, this current also offsets propagation and bending losses.

The waveguides of the splitter, as well as that of the DBR oscillator 12 and other structures on the single substrate 10, are InGaAs/GaAs quantum well active regions surrounded by AlGaAs cladding layers. The waveguides of the splitter 24 are approximately 2 micrometers wide. A third portion of substrate 10 is devoted to a plurality of phase adjusters 68, 70, 72 and 74. Each phase adjuster is a modulator responsive to current injection which provides up to at least $2\pi$ radians of phase shift relative to adjacent phase adjusters. Such a shift can be obtained from a single pulsed current source, with current distributed between adjusters with less than a 15 mA drop in current between adjacent phase adjusters. Alternatively, current injection into the separate phase adjuster regions 68, 70, 72 and 74 may be separately adjustable by distinct sources of current. Each phase modulation region is approximately 500 micrometers long.

Between the phase adjusters and the splitter 24 is a preamplifier 90, which has a waveguide layer aligned to receive light from the branches of the splitter and deliver this light to the phase adjusters after a modest amount of pumping by current, $I_{pm}$, delivered by wire 92 to stabilize and equalize the optical signals entering the phase adjusters. The waveguide of each phase adjuster feeds a corresponding waveguide in one of the flared amplifiers 78, 80, 82 and 84, respectively. Each flared region has a flare angle of approximately 3 degrees, slightly less than the divergence of light from the master oscillator 12. The flared amplifier regions reside in a fourth portion 85 of substrate 10. Exit regions of the flared amplifiers are spaced 500 micrometers center-to-center. Amplifier gain is provided by current supplied by wire 88, delivering a substantial amount of current to the amplifier. This current, typically exceeding 10 amps for four flared amplifiers, develops high power in the output signal. The relative amounts of current delivered by various wires in the substrate 10 are approximately 100 mA to the DBR oscillator, approximately 165 mA to the splitter network 24, approximately 22 mA to the preamplifier 90 and approximately 15 A to the flared amplifier region 85. A four element array with such currents exhibits over 5 watts of coherent pulsed power from a substrate which is approximately 4 mm×5 mm in size. The number of elements can be increased subject to gain saturation and heat dissipation limitations. Sizeable output power, comparable to large gas lasers, is available by increasing the number of elements. 60 watts of total power has been obtained with such light amplifiers, of which about 40 watts is spectrally coherent. The substrate is bonded on a copper heat sink and wire bonded to a ceramic chip housing for electrical contact.

The laser of the present invention has a far field pattern characteristic of an array of periodically spaced point sources. The far field pattern may be modified by lenses to merge the beam pattern to a single lobe in the far field.

Proper phasing is achieved by interfering outputs of less than all of the elements in the array. The interference pattern is adjusted for maximum contrast using the phase modulator associated with a flared amplifier from which an interfering beam portion emanates.

Figure 3:
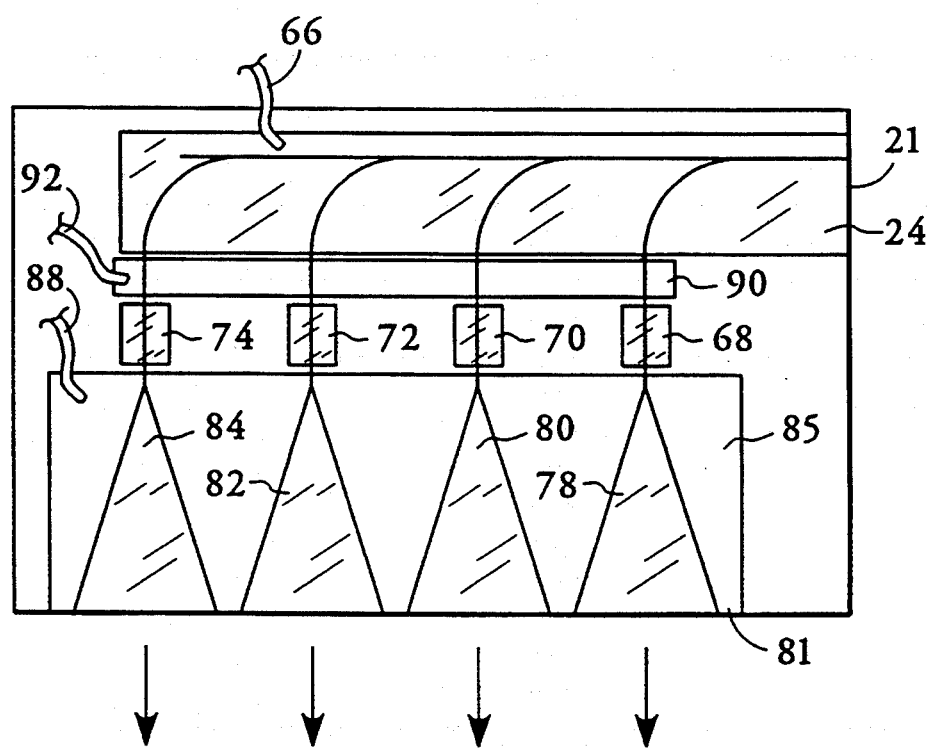
FIG. 3 is a top plan view of a self-resonating phased array of monolithic flared amplifiers in accord with the present invention.

The laser of FIG. 3 is similar to the structure of FIG. 2, except that the DBR oscillator is lacking. Instead, end 21 of the splitter 24 is made reflective. Similarly, the output facet 81 of the flared amplifier region 85 is also made reflective to support oscillations between the reflective end 21 and facet 81. All other structures shown in FIG. 2 are the same. The large amount of gain available in the structure sustains lasing as an unstable resonator. It is possible that different frequencies may be supported, since the strong frequency selection properties of the DBR laser are absent. Nevertheless, high power would be available from the structures of FIGS. 2 and 3, particularly where more branching is used. Indefinitely large amounts of power levels are available by increasing the amount of branching within limits of temperature and saturation. Currents necessary to sustain laser action are the same as in the example of FIG. 2 and applied in the same locations.

We claim:

1. A monolithic MOPA device comprising
   a laser oscillator,
   a plurality of flared amplifiers,
   optical power splitting means, optically coupled to said oscillator to receive light therefrom, for directing the light into said plurality of flared amplifiers, and
   phase shift means located between said optical power splitting means and each of said plurality of flared amplifiers for adjusting a relative phase of light emerging from each of said flared amplifiers.

2. The MOPA device of claim 1 wherein said optical power splitting means comprises
   a main waveguide trunk having an input coupled to an output of said laser oscillator, and
   a plurality of waveguide branches optically jointed to said main waveguide trunk for accepting light therefrom and extending away from said trunk, each of said waveguide branches having an output optically coupled through said phase shift means into one of said flared amplifiers.

3. The MOPA device of claim 1 wherein said phase shift means comprises a plurality of regions optically coupled to said optical power splitting means, said regions separately responsive to injected electric current to produce a selectable phase shift of up to at least $2\pi$ radians relative to adjacent regions of said phase shift means.

4. An integrated MOPA device monolithically fabricated in a substrate comprising,
- a laser oscillator disposed on a substrate, the oscillator having a waveguide extending therefrom into which the laser oscillator directs light,
- an optical power splitter disposed on the substrate and having a waveguide tree with a main waveguiding trunk optically jointed to the waveguide extending from the laser oscillator, accepting light therefrom, the waveguide tree also having a plurality of waveguiding branches extending away from the main waveguiding trunk, splitting power of the light from the main waveguiding trunk into the plurality of waveguiding branches,
- a plurality of phase adjusters disposed on the substrate in optical communication with said optical power splitter, each phase adjuster operatively associated with a waveguiding branch and having an output waveguide, and
- a plurality of flared amplifiers disposed on the substrate, each amplifier having an input connected to an output waveguide of a phase adjuster and having an output facet delivering amplified power from said substrate.

5. The MOPA device of claim 4 wherein each phase adjuster produces a selectable shift of up to at least $2\pi$ radians relative to an adjacent phase adjuster.

6. The MOPA device of claim 4 wherein said waveguide branches of the power splitter extend symmetrically away from the main waveguiding trunk of the power splitter.

7. The MOPA device of claim 4 wherein output facets of the flared amplifier are aligned with an edge of said substrate parallel to the waveguide of said oscillator.

8. The MOPA device of claim 4 wherein each waveguiding branch has a radius of curvature.

9. The MOPA device of claim 8 wherein said radius of curvature is less than 2 mm.

10. A laser monolithically integrated on a substrate comprising,
- a substrate,
- an optical power splitter disposed in a first portion of the substrate and having a waveguide tree with a main waveguiding trunk having a reflective end and with a plurality of waveguiding branches extending away from the main waveguiding trunk, splitting power of the light from the waveguiding trunk into the plurality of waveguiding branches,
- a plurality of phase adjusters disposed in a second portion of the substrate, each phase adjuster operatively associated with a waveguiding branch and having an output waveguide, and
- a plurality of flared amplifiers disposed in a third portion of the substrate, each amplifier having an input connected to an output waveguide of a phase adjuster and having a reflective facet establishing a resonant cavity with said reflective end of said main waveguiding trunk, the resonant cavity being pumped with sufficient current to sustain laser action, with laser light being emitted through at least one of said reflective end and reflective facet.

11. A monolithic light amplifying device comprising a plurality of flared amplifiers disposed on a substrate,
- optical power splitting means, disposed on the substrate and having an input, for receiving light at said input and for directing the light into said plurality of flared amplifiers, and
- phase shift means, disposed in the substrate between said optical power splitting means and each of said plurality of flared amplifiers, for adjusting a relative phase of light emerging from each of said flared amplifiers.

* * * * *